United States Patent [19]
Yoo et al.

[11] Patent Number: 5,747,848
[45] Date of Patent: May 5, 1998

[54] NONVOLATILE MEMORY DEVICES INCLUDING ARRAYS OF DISCRETE FLOATING GATE ISOLATION REGIONS

[75] Inventors: Jong-weon Yoo; Keon-soo Kim, both of Kyungki-do, Rep. of Korea

[73] Assignee: Samsung Electronics Co., Ltd., Suwon, Rep. of Korea

[21] Appl. No.: 769,589

[22] Filed: Dec. 18, 1996

[30] Foreign Application Priority Data

Dec. 27, 1995 [KR] Rep. of Korea ............ 95-59506

[51] Int. Cl.$^6$ .................. H01L 29/788; H01L 27/108
[52] U.S. Cl. .................. 257/316; 257/296; 257/314; 257/315; 365/185.16; 365/185.17; 365/185.18
[58] Field of Search .................. 257/296, 314, 257/315, 316; 365/185.16, 185.17, 185.18

[56] References Cited

U.S. PATENT DOCUMENTS 5,303,187  4/1994  Yu ............................. 365/185
5,432,129  7/1995  Hodges ....................... 437/200
5,589,699  12/1996  Araki ......................... 257/316

*Primary Examiner*—Valencia Martin Wallace
*Attorney, Agent, or Firm*—Myers Bigel Sibley & Sajovec

[57] ABSTRACT

Nonvolatile memory devices include a substrate, and an array of field isolation regions in the substrate. The array of field isolation regions define a plurality of spaced apart first active regions in the substrate, which extend along the substrate in a first direction. The array of field isolation regions also define a plurality of spaced apart second active regions in the substrate, which extend along the substrate in a second direction which is orthogonal to the first direction. An array of floating gate isolation regions is also provided. A respective one of the floating gate isolation regions is on a respective one of the array of field isolation regions. The floating gate isolation regions extend on the corresponding field isolation region along the first direction. The array of floating gate isolation regions can prevent damage to the substrate when the floating gate is defined using the control gate as a mask.

8 Claims, 6 Drawing Sheets

NONVOLATILE MEMORY DEVICES INCLUDING ARRAYS OF DISCRETE FLOATING GATE ISOLATION REGIONS

FIELD OF THE INVENTION

This invention relates to integrated circuit memory devices, and more particularly to integrated circuit nonvolatile memory devices.

BACKGROUND OF THE INVENTION

Integrated circuit nonvolatile memory devices are widely used for storing data which is to be retained after power is removed from the devices. As is well known to those having skill in the art, nonvolatile memory devices generally include an array of nonvolatile memory cells. Each memory cell includes a stacked floating gate and control gate. A bit line is used to read information stored in the memory cell. A control gate electrode and a word line are also included. Nonvolatile memory devices are widely used and need not be described further herein.

As also understood by those having skill in the art, flash memory devices are a type of nonvolatile memory device in which the entire memory or subsections thereof can be erased in group erase operations. Flash memory devices include NOR-type and NAND-type devices. In NAND-type devices, 8, 16 or more memory cell transistors are connected in series to a bit line contact. In a NOR-type flash memory, two or more memory cell transistors are connected in parallel to a bit line contact. NOR-type flash memories may be higher speed than NAND-type memories and are often used for high speed DRAM interface flash memories.

FIGS. 1A–1E illustrate a conventional nonvolatile memory device during intermediate fabrication steps. As shown in FIG. 1A, an array of field isolation regions 13, often referred to as field oxide regions, are formed in an integrated circuit substrate. The array of field isolation regions 13 define a plurality of spaced apart first active regions 14 in the substrate, which extend along the substrate in a first direction, shown in FIG. 1A as vertical. The array of field isolation regions 13 also define a plurality of spaced apart second active regions 15 in the substrate, which extend along the substrate in a second direction which is orthogonal to the first direction, shown in FIG. 1A as horizontal.

A plurality of bit line contacts 3a and 3b are located in each of the first active regions 14. The respective bit line contact is located between adjacent second active regions 15. A plurality of spaced apart control gates 16 extend along the substrate in the second direction. A respective control gate is located between a bit line contact 3a or 3b and a second active region 15. A plurality of floating gate isolation regions 7 also extend in the first direction, between adjacent first active regions 14. As shown, the floating gate isolation regions extend continuously along the first direction, on the second active regions and on the field isolation regions 13.

Nonvolatile memory devices as shown in FIG. 1A may be fabricated by forming the array of field isolation regions 13 in a semiconductor substrate to define the first active regions 14 and the second active regions 15. A first dielectric film, not shown in FIG. 1A, is then blanket formed on the semiconductor substrate. A floating gate electrode material is then blanket formed on the first dielectric film. The floating gate electrode material which is parallel to the first active region 14, between the bit line contact 3a and the bit line contact 3b is then removed using conventional patterning techniques, to thereby form the floating gate isolation region 7.

A second dielectric layer, not shown in FIG. 1A, and a control gate electrode material are then blanket deposited on the semiconductor substrate. The control gate material is then patterned so that the control gate electrode material remains between the bit line contacts 3a and 3b and the second active regions 15, to form control gate 16 which extend parallel to the second active regions 15. The second dielectric layer is then etched using the control gate 16 as a mask. The remaining floating gate electrode material is then etched in a self-aligned etch. A bit line which connects the bit line contacts 3a and 3b is then formed.

During the process of etching the floating gate material to thereby form the floating gate isolation region 7, as described above, the semiconductor substrate may be exposed at a region L where the floating gate isolation region 7 intersects the second active regions 15. When the second dielectric layer is later etched using the control gate 16 as a mask, the substrate may become pitted at location L during etching.

This pitting is illustrated in FIGS. 1B and 1C, which are cross-sectional views taken along lines A-A' and B-B' of FIG. 1A, respectively. As shown in FIG. 1C, when a dielectric layer (not shown) and the control gate 16 are formed on the field oxide region 13, the semiconductor substrate 11 in the second active region is etched. Unfortunately, due to the pitting of the substrate, an opening or increased resistance of the source line may occur during subsequent processes when the source line is formed to connect the source regions of each memory cell transistor in the second active region 15.

In particular, ions may be implanted in the direction shown in FIG. 1D and may cause an opening or increased resistance at region a of the source line. As shown in FIG. 1E, when ion implantation is performed in a symmetrical manner in the directions shown by the arrows, another type of pitting occurs and an opening or increased resistance may be obtained as shown in section b. The open circuit or increased resistance may make it difficult for the nonvolatile memory to operate properly, and may decrease fabrication yield.

SUMMARY OF THE INVENTION

It is therefore an object of the present invention to provide improved nonvolatile memory devices.

It is another object of the present invention to provide nonvolatile memory devices which reduce the likelihood of source line opening during the manufacture thereof.

It is still another object of the present invention to provide nonvolatile memory devices which can provide low source line resistance.

These and other objects are provided, according to the present invention, by nonvolatile memory devices which include an array of discrete floating gate isolation regions instead of continuous spaced apart floating gate isolation regions. By providing an array of discrete floating gate isolation regions rather than continuous floating gate isolation regions, etching of the second active regions of the substrate may be reduced or prevented, thereby reducing or preventing source line opening or increased resistance.

More specifically, nonvolatile memory devices according to the present invention include an array of nonvolatile memory cells in the substrate, and an array of field isolation regions which isolate the nonvolatile memory cells from one another. An array of floating gate isolation regions is also included. A respective floating gate isolation region is on a respective one of the array of field isolation regions.

Even more specifically, nonvolatile memory devices according to the present invention include a substrate and an array of field isolation regions in the substrate. The array of field isolation regions define a plurality of spaced apart first active regions in the substrate, which extend along the substrate in a first direction. The array of field isolation regions also define a plurality of spaced apart second active regions in the substrate, which extend along the substrate in a second direction which is orthogonal to the first direction. A plurality of bit line contacts are located in each of the first active regions. A respective bit line contact is located between adjacent second active regions. A plurality of spaced apart control gates is also included. The control gates extend along the substrate in the second direction. A respective control gate is located between a bit line contact and a second active region.

An array of floating gate isolation regions is also included. A respective one of the floating gate isolation regions is on a respective one of the array of field isolation regions. The floating gate isolation regions extend on the corresponding field isolation region along the first direction. The nonvolatile memory device also includes an array of nonvolatile memory cell transistors in the first and second active regions. The nonvolatile memory cell transistors each include a floating gate and a control gate. A respective nonvolatile memory cell transistor is electrically connected to a respective bit line contact and to a respective control gate.

In a first embodiment of the present invention, the floating gate isolation regions are shorter than the corresponding field isolation regions, along the first direction. In another embodiment, the floating gate isolation regions are longer than the corresponding field isolation regions, along the first direction, so that the floating gate isolation regions extend onto the second active regions. The floating gate isolation regions may extend beyond the corresponding pair of control gates along the first direction.

In other embodiments according to the present invention, the control gates are narrower adjacent the floating gate isolation regions relative to remote from the floating gate isolation regions. Accordingly, the floating gate regions extend beyond the corresponding pair of control gates, along the first direction. The floating gate isolation region (and in some embodiments, the control gate) is modified so that pitting of the substrate while the floating gate is patterned using the control gate as a mask, can be reduced or prevented. Thus, during ion implantation to form a source line, opening of the source line can be reduced so that the electrical resistance of the source need not increase. Improved operation and improved manufacturing yields may thereby be provided.

DETAILED DESCRIPTION OF PREFERRED EMBODIMENTS

Figure 1A:
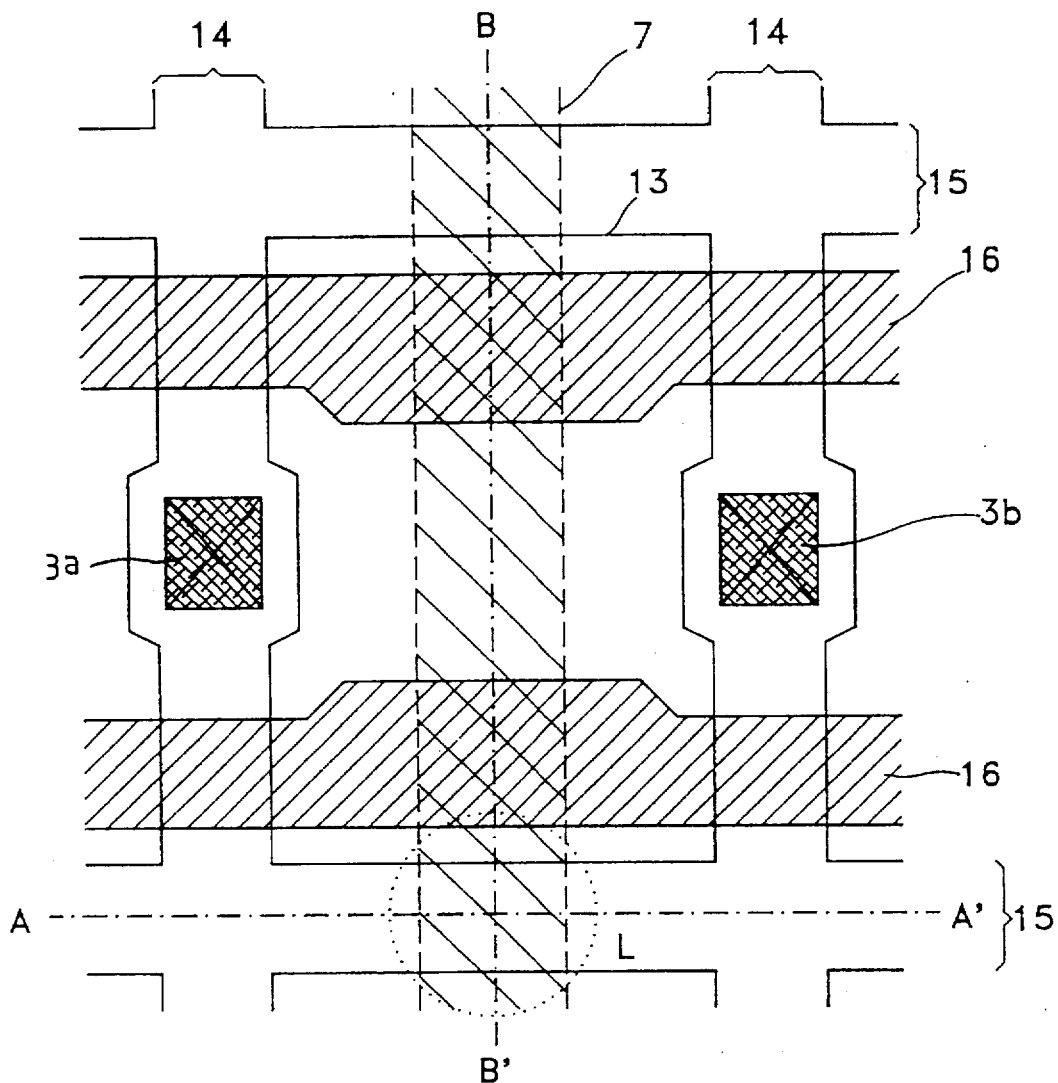
FIG. 1A is a top view of a conventional nonvolatile memory device.
Figure 1B:
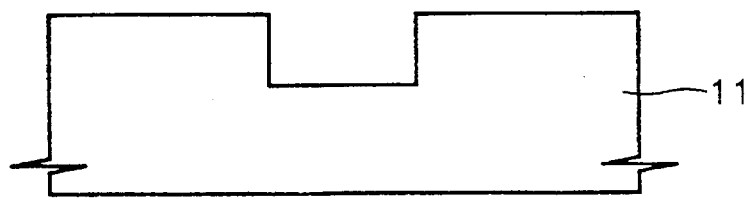
FIGS. 1B–1E are cross-sectional views of the nonvolatile memory device of FIG. 1A.
Figure 1C:
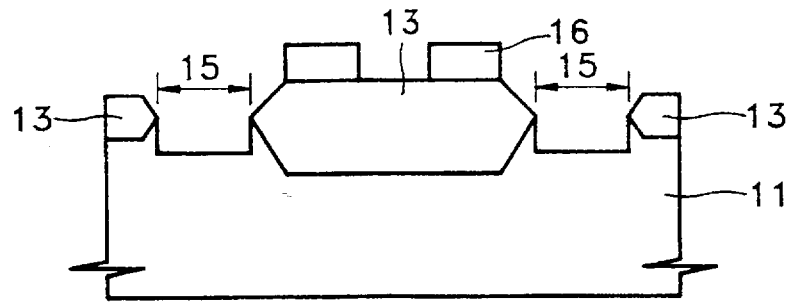
Figure 1D:
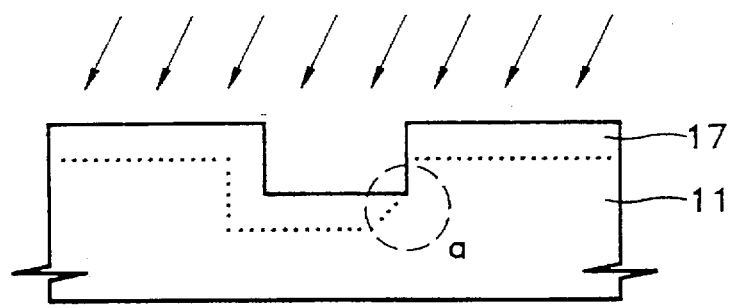
Figure 1E:
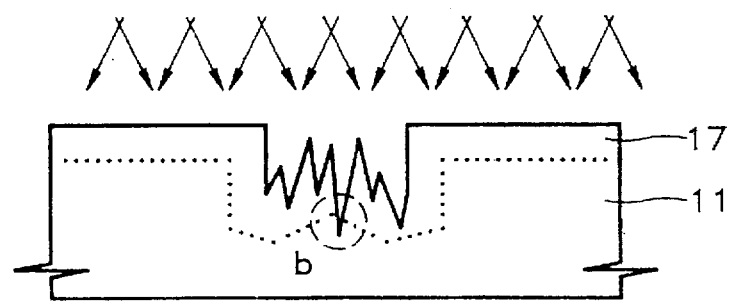

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 2A:
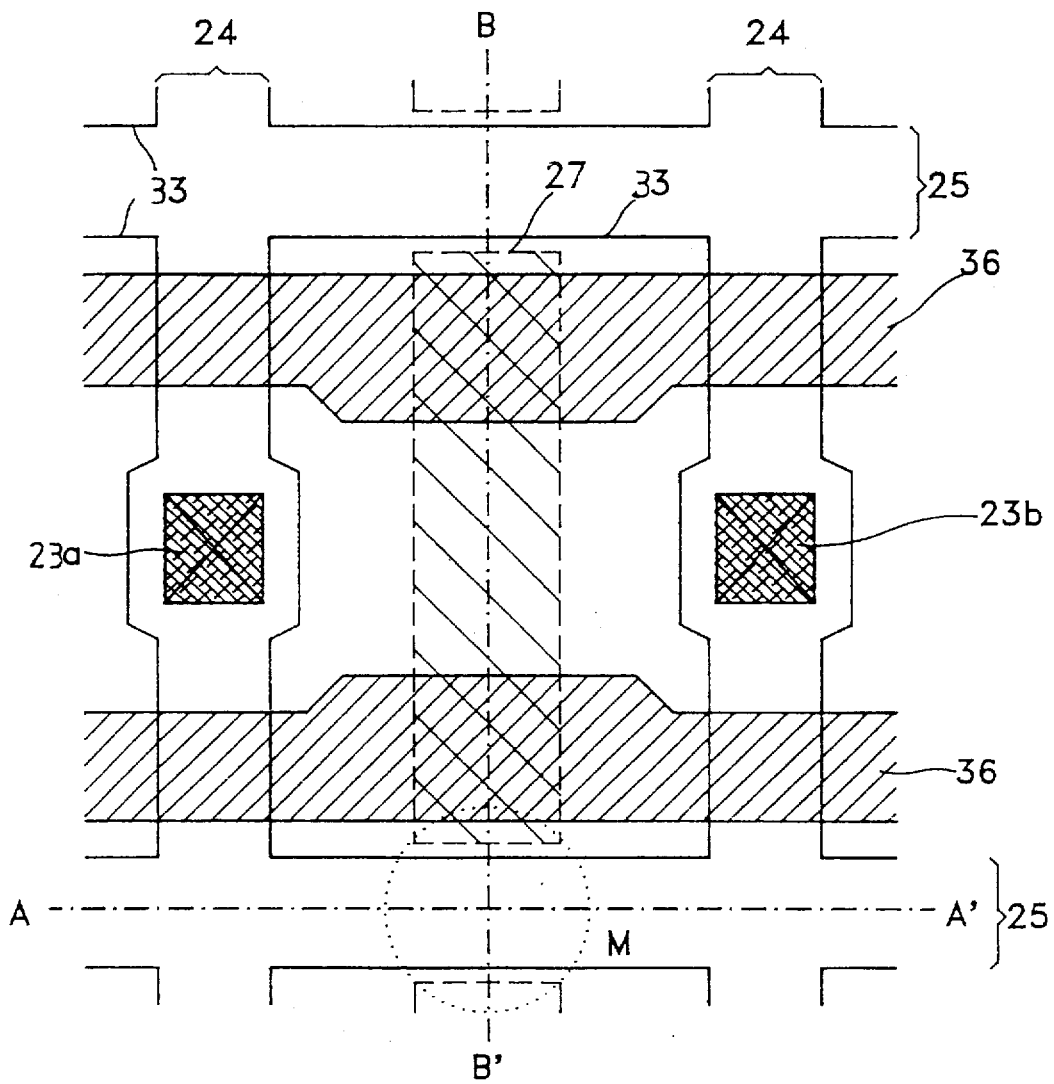
FIG. 2A is a top view of first embodiments of nonvolatile memory devices according to the present invention.
Figure 2B:
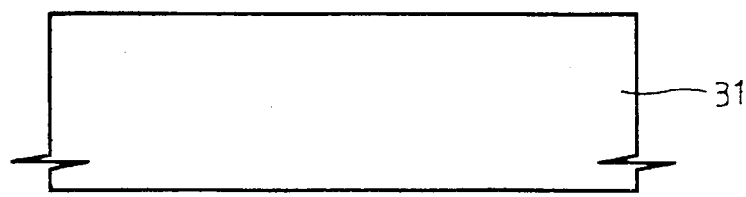
FIGS. 2B and 2C are cross-sectional views of FIG. 2A.
Figure 2C:
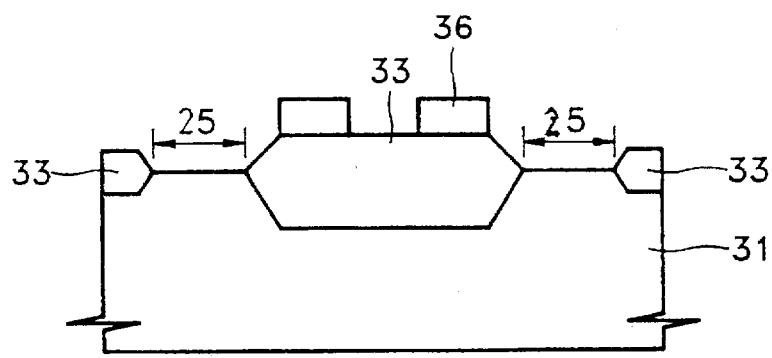

Referring now to FIGS. 2A–2C, nonvolatile memory devices according to the present invention include a substrate 31 and an array of field isolation regions 33, also referred to as field oxide regions, in the substrate. The array of field isolation regions 33 define a plurality of spaced apart first active regions 24 in the substrate which extend along the substrate in a first direction, shown in FIG. 2A as vertical. The array of field isolation regions also define a plurality of spaced apart second active regions 25 in the substrate, which extend along the substrate in a second direction which is orthogonal to the first direction, shown in FIG. 2A as horizontal. A plurality of bit line contacts 23a and 23b in each of the first active regions 24 are also provided. A respective bit line contact is located between adjacent second active regions 25. A plurality of spaced apart control gates 36 extend along the substrate in the second direction. A respective control gate is located between a bit line contact 23a or 23b and a second active region 25.

As also shown in FIG. 2A, an array of floating gate isolation regions 27 is included. A respective one of the floating gate isolation regions 27 is on a respective one of the array of field isolation regions 33. The floating gate isolation regions 27 extend on the corresponding field isolation region 33 along the first direction, shown in FIG. 2A as vertical.

It will be understood that memory cell transistors generally are symmetrically formed around the bit line contacts 23a and 23b. A source line is generally formed in active regions 24.

According to the invention, and as shown in FIG. 2A, in order to prevent opens or increased resistance of the memory cell transistors, the floating gate isolation region 27 is formed over the field oxide region 33 and is shorter than the field oxide region 33. Thus, during fabrication of the nonvolatile memory devices of FIG. 2A, when the floating gate material is etched in a self-aligned manner using the control gate 36 as a mask, the floating gate electrode material remaining in a portion M where the upper and lower portions of the floating gate isolation regions 27 intersect the second active region 25, is etched. Pitting of the semiconductor substrate during etching therefore does not occur.

FIGS. 2B and 2C are cross-sectional views taken along lines A-A' and B-B' of FIG. 2A respectively. A dielectric layer (not shown) and a control gate 36 are sequentially formed on the field oxide region 33. Pitting does not occur on the second active region 25 where the source line is formed. Therefore, during the subsequent ion implantation which forms the source lines, open circuits and increased resistance of the source lines due to the step difference generated in the semiconductor substrate at the active region is reduced or prevented. The performance and yields of the devices may thereby be increased.

Figure 3A:
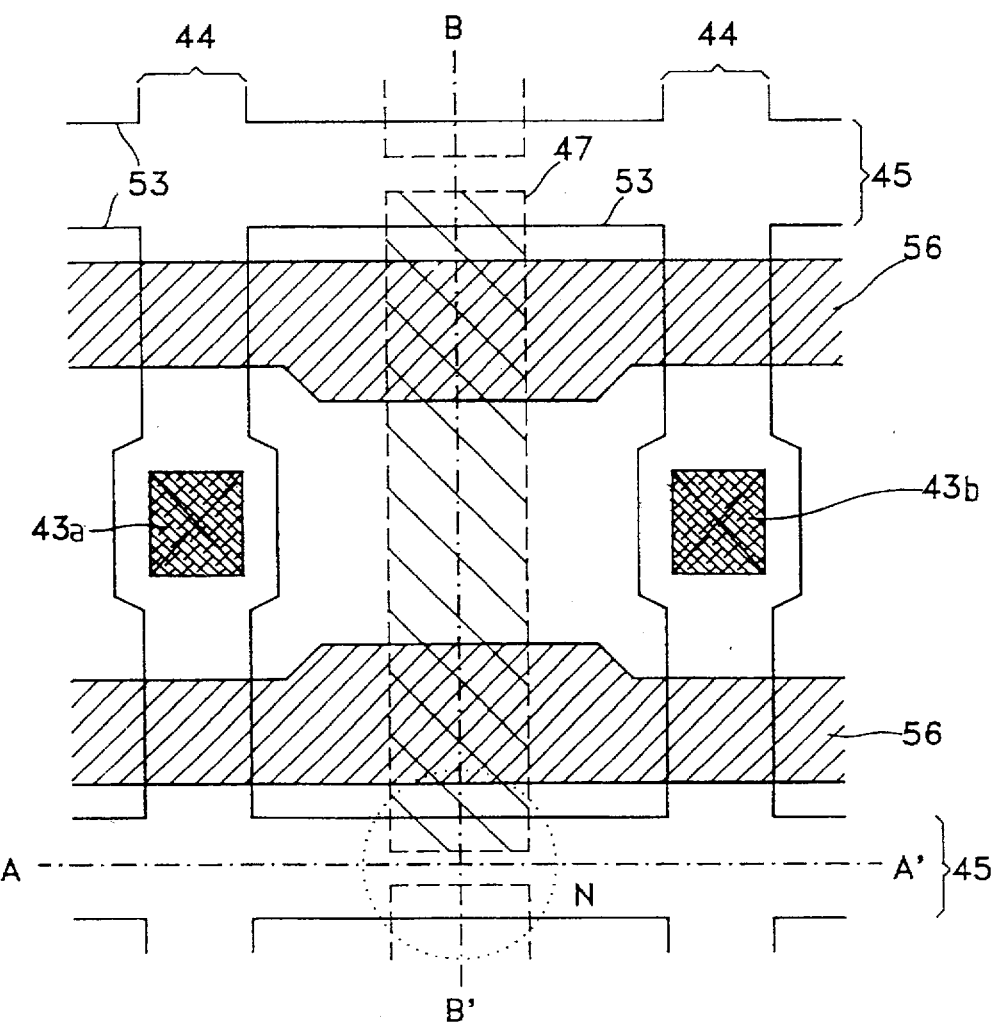
FIG. 3A is a top view of second embodiments of nonvolatile memory devices according to the present invention.
Figure 3B:
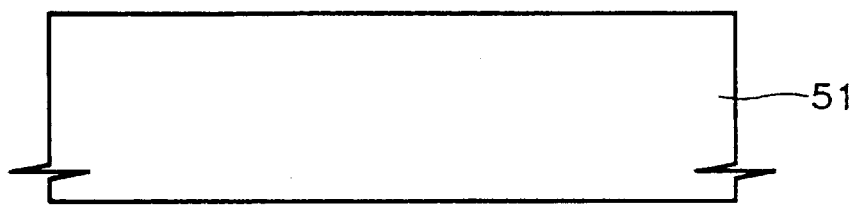
FIGS. 3B and 3C are cross-sectional views of FIG. 3A.
Figure 3C:
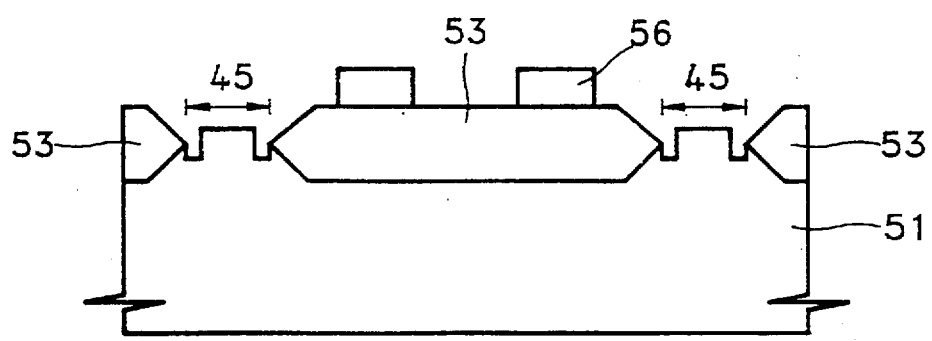

FIGS. 3A–3C illustrate a second embodiment of the present invention. In FIGS. 3A–3C, the reference numbers of FIG. 2A have been incremented by twenty. Thus, numerals 43a and 43b indicate bit line contacts and reference numeral 47 indicates the floating gate isolation region. Reference numeral 51 indicates the semiconductor substrate and reference numeral 33 indicates a field oxide film. Reference numeral 44 indicates a first active region and reference numeral 45 indicates a second active region. Reference numeral 56 indicates a control gate.

As shown in FIG. 3A, the floating gate isolation region 47 is formed on the corresponding field oxide region 53. However, the length of the floating gate isolation region in the first direction is longer than the field oxide region 53 in the first direction. Stated differently, the floating gate isolation regions are longer than the corresponding field isolation regions, along the first direction, so that the floating gate isolation regions extend into the second active regions.

In FIG. 3A, since the floating gate isolation region 47 partially overlaps with the second active region 45, the region N where the ends of adjacent floating gate isolation regions 47 approach one another and intersect the second active region 45, is divided into a portion where the floating gate electrode material remains and a portion where the semiconductor substrate is exposed. Thus, when the floating gate electrode material is etched using the control gate 56 as a mask, pitting of the exposed semiconductor substrate occurs at region N. However, since very little etching is performed, opens or increased resistance in the source line need not occur during subsequent processes in which the source line is formed.

FIGS. 3B and 3C are cross-sectional views taken along lines A-A' and B-B' of FIG. 3A. As shown, a reduced amount of etching of the second active region 45 takes place.

Figure 4:
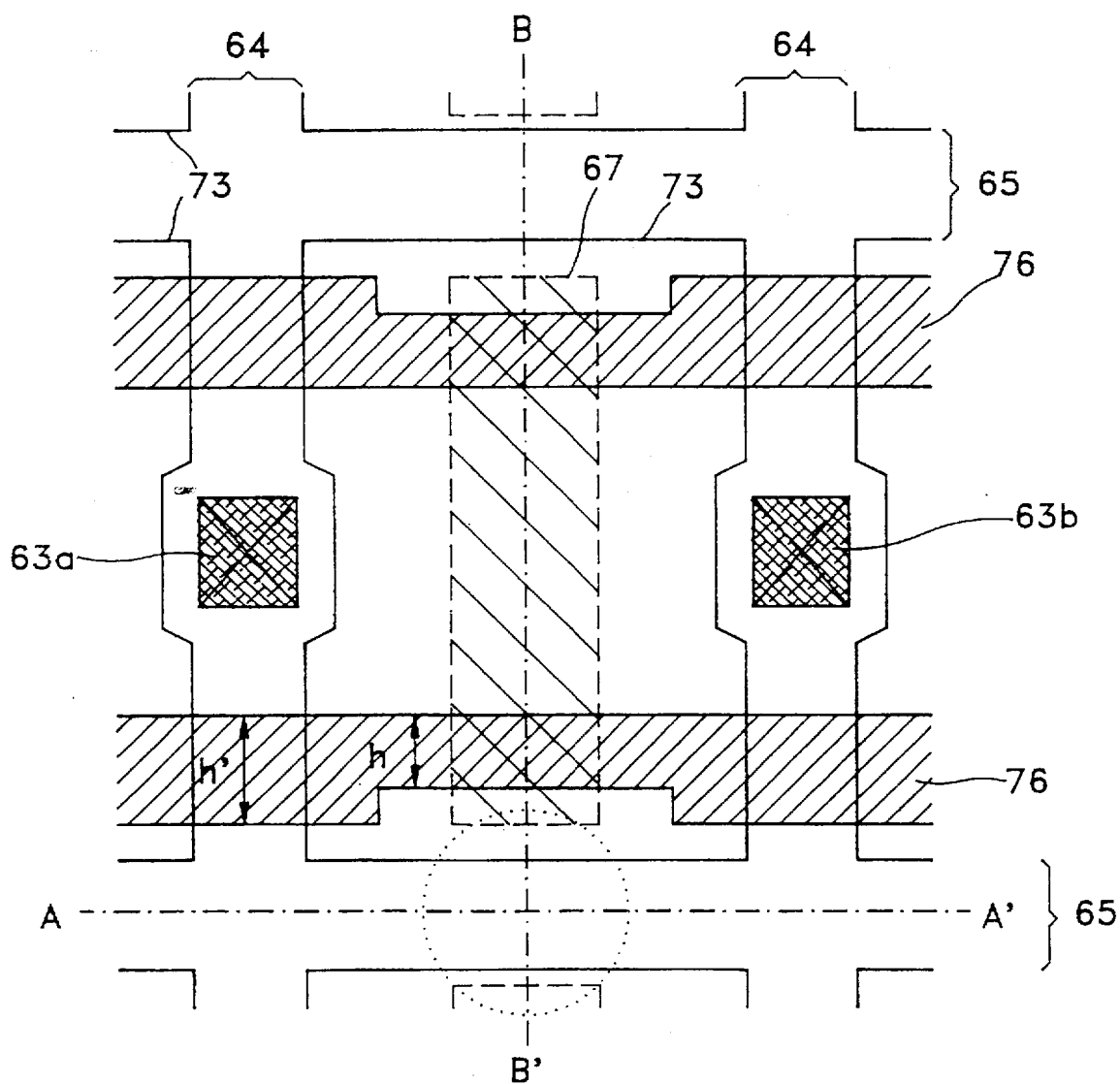
FIG. 4 is a top view of third embodiments of nonvolatile memory devices according to the present invention.

FIG. 4 is a top view of a third embodiment of the present invention. Each of the reference numerals in FIG. 3A has been increased by twenty in FIG. 4. Thus, numerals 63a and 63b indicate bit line contacts and reference numeral 67 indicates the floating gate isolation region. Reference numeral 73 indicates a field oxide film. Reference numeral 64 indicates a first active region and reference numeral 65 indicates a second active region. Reference numeral 76 indicates the control gate.

As shown in FIG. 4, the control gates are narrower adjacent the floating gate isolation regions relative to remote from the floating gate isolation regions, so that each of the floating gate isolation regions extends beyond the corresponding pair of control gates, along the first direction. More specifically, as shown in FIG. 4, the width h of the control gate is narrower adjacent the floating gate isolation region 67 relative to the width h' of the first active region, remote from the floating gate isolation region.

Accordingly, the channel length between the drain and source of memory cell transistors formed in the first active regions may be increased. The remaining fabrication process is similar to that described earlier. It will be understood that in FIG. 4, in order to prevent opening or increased resistance of the sources of the memory cell transistors, the floating gate isolation regions 67 are also preferably shorter than the corresponding field isolation region 73 along the first direction.

In conclusion, an array of discrete floating gate isolation regions is provided, and the shape of the control gates may be modified, to reduce pitting of the semiconductor substrate during etching of the floating gate using the control gate as a mask in a self-aligned process. Thus, in subsequent ion implantation steps which form the source line, the source line can be prevented from being electrically opened or increased in resistance. Operation of the nonvolatile memory devices and manufacturing yields may thereby be improved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A nonvolatile memory device comprising:

a substrate;

an array of field isolation regions in the substrate, the array of field isolation regions defining a plurality of spaced apart first active regions in the substrate, which extend along the substrate in a first direction, the array of field isolation regions also defining a plurality of spaced apart second active regions in the substrate, which extend along the substrate in a second direction which is orthogonal to the first direction;

a plurality of bit line contacts in each of the first active regions, a respective bit line contact being located between adjacent second active regions;

a plurality of spaced apart control gates, extending along the substrate in the second direction, a respective control gate being located between a bit line contact and a second active region; and an array of floating gate isolation regions, a respective one of which is on a respective one of the array of field isolation regions, the floating gate isolation regions extending on the corresponding field isolation region along the first direction;

wherein the floating gate isolation regions are longer than the corresponding field isolation regions, along the first direction, so that the floating gate isolation regions extend onto the second active regions.

2. A nonvolatile memory device according to claim 1 further comprising:

an array of nonvolatile memory cell transistors in the first and second active regions, the nonvolatile memory cell transistors each including a floating gate and a control gate, a respective nonvolatile memory cell transistor being electrically connected to a respective bit line contact and a respective control gate.

3. A nonvolatile memory device according to claim 2 wherein each nonvolatile memory transistor includes a source and a drain, and wherein a respective bit line contact is connected to a respective drain.

4. A nonvolatile memory device according to claim 1 wherein the control gates are narrower on the floating gate isolation regions relative to on the first active regions.

5. A nonvolatile memory device comprising:

a substrate;

an array of field isolation regions in the substrate, the array of field isolation regions defining a plurality of spaced apart first active regions in the substrate, which extend along the substrate in a first direction, the array of field isolation regions also defining a plurality of spaced apart second active regions in the substrate, which extend along the substrate in a second direction which is orthogonal to the first direction;

a plurality of bit line contacts in each of the first active regions, a respective bit line contact being located between adjacent second active regions;

a plurality of spaced apart control gates, extending along the substrate in the second direction, a respective control gate being located between a bit line contact and a second active region; and an array of floating gate isolation regions, a respective one of which is on a respective one of the array of field isolation regions, the floating gate isolation regions extending on the corresponding field isolation region along the first direction;

wherein the control gates are narrower on the floating gate isolation regions relative to on the first active regions.

6. A nonvolatile memory device according to claim 5 further comprising:

an array of nonvolatile memory cell transistors in the first and second active regions, the nonvolatile memory cell transistors each including a floating gate and a control gate, a respective nonvolatile memory cell transistor being electrically connected to a respective bit line contact and a respective control gate.

7. A nonvolatile memory device according to claim 5 wherein the floating gate isolation regions are longer than the corresponding field isolation regions, along the first direction, so that the floating gate isolation regions extend onto the second active regions.

8. A nonvolatile memory device according to claim 6 wherein each nonvolatile memory transistor includes a source and a drain, and wherein a respective bit line contact is connected to a respective drain.

* * * * *